United States Patent
Sakurai et al.

[11] Patent Number: 6,082,373
[45] Date of Patent: Jul. 4, 2000

[54] CLEANING METHOD

[75] Inventors: Naoaki Sakurai; Hisashi Nishigaki; Naoya Hayamizu; Hiroshi Fujita, all of Yokohama, Japan

[73] Assignee: Kabushiki Kaisha Toshiba, Kawasaki, Japan

[21] Appl. No.: 09/109,066

[22] Filed: Jul. 2, 1998

[30] Foreign Application Priority Data

| Jul. 5, 1996 | [JP] | Japan | ................................. 8-176440 |
| Jul. 2, 1997 | [JP] | Japan | ................................. 9-177153 |

[51] Int. Cl.[7] .............................. B08B 3/00; B08B 3/12; B08B 5/00; B03C 23/00
[52] U.S. Cl. ..................... 134/1; 134/2; 134/3; 134/26; 134/31; 134/36; 134/102.1; 134/102.2
[58] Field of Search .................................. 134/1, 902, 2, 134/3, 26, 31, 36, 102.1, 102.2; 210/321.69, 500.23, 636; 422/20

[56] References Cited

U.S. PATENT DOCUMENTS

| 5,261,966 | 11/1993 | Mashimo et al. | ........................... 134/2 |
| 5,322,082 | 6/1994 | Shibano | ................................. 134/186 |
| 5,383,483 | 1/1995 | Shibano | ................................. 134/111 |
| 5,415,191 | 5/1995 | Mashimo et al. | ................... 134/102.1 |
| 5,447,171 | 9/1995 | Shibano | .............................. 134/102.2 |
| 5,735,934 | 4/1998 | Spears | ........................................ 75/414 |
| 5,759,751 | 6/1998 | Shimizu et al. | ......................... 430/329 |
| 5,911,836 | 6/1999 | Hada et al. | ................................. 134/2 |

FOREIGN PATENT DOCUMENTS

| 9-10712 | 1/1997 | Japan . |
| 9-19668 | 1/1997 | Japan . |

*Primary Examiner*—Zeinab El-Arini
*Attorney, Agent, or Firm*—Oblon, Spivak, McClelland, Maier & Neustadt, P.C.

[57] ABSTRACT

Provided is a cleaning method for effectively removing particles on the surface of an object to be cleaned. This cleaning method includes dissolving oxygen into deaerated pure water to prepare a cleaning fluid, and cleaning an object to be cleaned by bringing the object into contact with the cleaning fluid to which ultrasonic vibration is being applied.

26 Claims, 2 Drawing Sheets

CLEANING METHOD

BACKGROUND OF THE INVENTION

The present invention relates to a cleaning method which is carried out in the process for producing a semiconductor device, a liquid crystal display or an electric element.

In producing, for example, a semiconductor device, particles such as organic or inorganic materials have been removed which adhere to a bare wafer or a wafer which is covered with an oxide film. Adhesion of the particles may result in generation of defects in the semiconductor device.

Thus, the particles have been hitherto removed by using a cleaning fluid comprising pure water (ultra pure water), or pure water (ultra pure water) from which dissolved air such as oxygen is removed. In the case of cleaning an object to be cleaned, for example, after rinsing the object with chemicals or a surfactant, the object is immersed into a cleaning tank and then the tank is overflowed with the cleaning fluid to clean the object, or the cleaning fluid is jetted out from nozzles to the object to clean the object. In particular, in the case of jetting out the cleaning fluid from the nozzles to the object to be cleaned, for the purpose of improvement on cleaning power and efficiency of removing particles the cleaning fluid is jetted out while thereto ultrasonic vibration is applied.

However, according to the aforementioned cleaning method, it is not necessarily possible to efficiently remove the particles adhering onto the surface of the portion to be cleaned, such as the surface of a bare wafer.

BRIEF SUMMARY OF THE INVENTION

An object of the present invention is to provide a cleaning method for efficiently removing particles from an object to be cleaned.

Another object of the present invention is to provide a cleaning method for efficiently removing particles adhering on a semiconductor wafer having a surface on which an embedded metal wiring is formed without the embedded metal wiring being corroded.

An aspect of the present invention is a cleaning method comprising the steps of:

dissolving oxygen into deaerated pure water to prepare a cleaning fluid; and cleaning an object cleaned by bringing the object into contact with the cleaning fluid to which ultrasonic vibration is being applied.

Another aspect of the present invention is a cleaning method comprising the steps of:

dissolving nitrogen into deaerated pure water to prepare a cleaning fluid; and cleaning an object to be cleaned by bringing the object into contact with the cleaning fluid to which ultrasonic vibration is being applied.

Still another aspect of the present invention is a cleaning method comprising the steps of:

dissolving hydrogen obtained by electrolyzing water into deaerated pure water to prepare a cleaning fluid; and cleaning an object to be cleaned by bringing the object into contact with the cleaning fluid to which ultrasonic vibration is being applied.

Yet another aspect of the present invention is a cleaning method comprising the steps of:

dissolving oxygen in an amount of from 2 to 40 ppm into deaerated pure water to prepare a cleaning fluid; and bringing a semiconductor wafer having a surface on which an embedded metal wiring is formed by chemical-mechanical polishing into contact with the cleaning fluid to which ultrasonic vibration is being applied.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

The cleaning method according to the present invention will be described below.

(The first step)

Air contained in pure water is firstly removed, and then oxygen is dissolved into the pure water to prepare a cleaning fluid.

The term "pure water" noted above denotes water which has a resistivity of 18 MΩ or more. It is preferred that the pure water is used or ultrapure water.

For dissolving oxygen into pure water, for example, the following methods may be used:

(1) The method of bubbling oxygen into pure water, and (2) The method of supplying oxygen into respective hollow fibers of a hollow fiber module comprised of a material having oxygen gas permeability and supplying pure water onto the surface of the respective hollow fibers to dissolve oxygen into the pure water by gas-liquid contact.

In the case of dissolving oxygen into the pure water, a detector of detecting the amount of dissolved oxygen, for example, in a separating membrane form, may be immersed into the pure water and a pressure adjusting valve may be disposed at an oxygen supplying path. In this case, the amount of dissolved oxygen in the pure water is detected by the detector and then the detected result is fed back to the pressure adjusting valve, so that the amount of dissolved oxygen in the pure water can be controlled.

As oxygen, oxygen produced by electrolyzing water or supplied from an oxygen bombs may be used. In particular, use of oxygen produced by electrolyzing water makes it possible to overcome such economical problems as exchanging of the cylinder or needing a place for stocking the bombs in the case of dissolving oxygen from the oxygen bombs into the pure water. The cleaning fluid obtained from anode electrolyzed water, wherein oxygen is dissolved in water by directly electrolyzing the water, may be contaminated by incorporation of impurities from electrodes. On the contrary, the cleaning fluid wherein oxygen produced by electrolyzing water is dissolved into deaerated pure water makes it possible to prevent incorporation of impurities from electrodes and contamination.

It is preferred that the amount of oxygen dissolved into the pure water is 0.5 ppm or more. According to the oxygen dissolving methods (1) and (2), oxygen can be dissolved into pure water up to about 20 ppm at 25° C.

Figure 1:
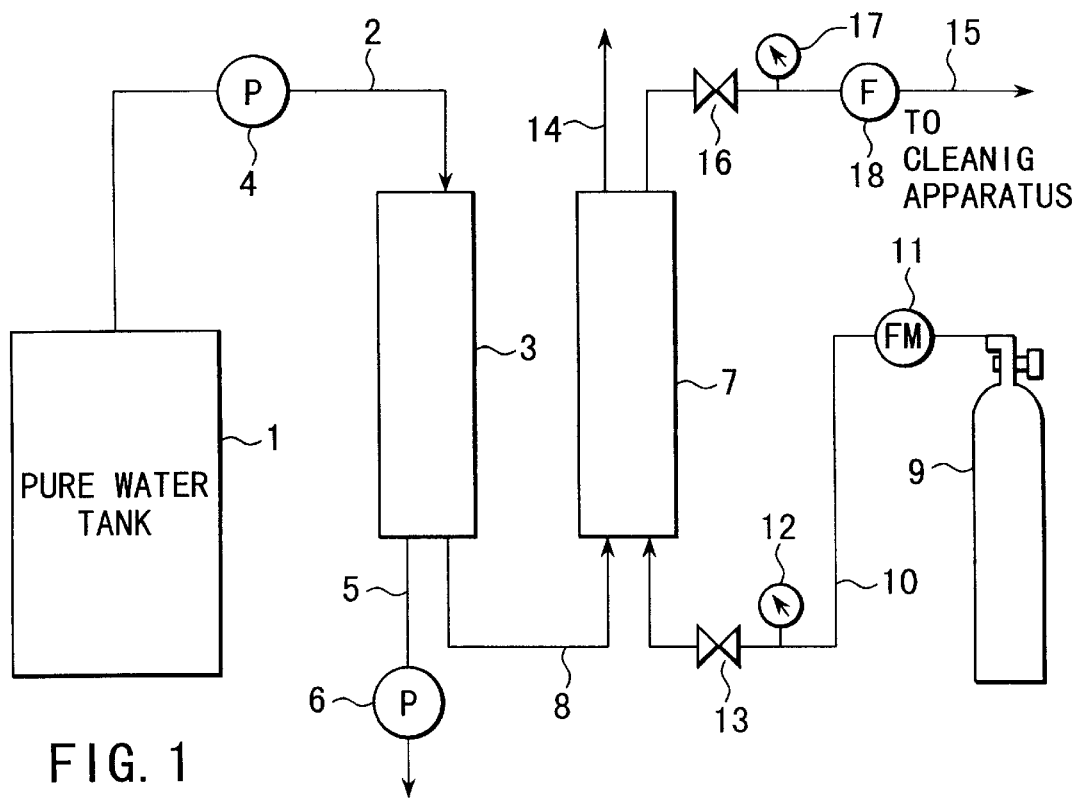
FIG. 1 is a view illustrating a cleaning fluid preparing apparatus having an oxygen dissolving tower into which compressed oxygen is introduced.

A cleaning fluid having a large amount of dissolved oxygen can be prepared by using, in particular, a cleaning fluid preparing apparatus having an oxygen dissolving tower into which compressed oxygen is introduced, which is shown in FIG. 1 and will be described below.

Referring to FIG. 1, a pure water tank 1 is connected to a deaerating tower 3 through a laying pipe 2. A compressing pump 4 is disposed in the middle of the laying pipe 2. The deaerating tower 3 is divided into two compartments with a gas permeable membrane (not shown) extended along the vertical direction. The gas permeable membrane is made of a porous film of, for example, polytetrafluoroethylene or polypropylene. The laying pipe 2 is connected to the upper portion of the deaerating tower 3, at which one (the right compartment) of the compartments is positioned. A gas discharging pipe 5 is connected to the lower portion of the deaerating tower 3, at which the other compartment (the left compartment) is positioned. A vacuum pump 6 is disposed in the middle of the gas discharging pipe 5.

An oxygen dissolving tower 7 in which a hollow fiber module not shown is charged is arranged adjacently to the deaerating tower 3. The deaerating tower 3 is connected to the bottom of the oxygen dissolving tower 7 through a pipe 8 extending from the bottom of the deaerating tower 3, at which the right compartment is positioned. Pure water deaerated in the deaerating tower 3 is supplied into the oxygen dissolving tower 7 so as to contact the outer surface of the module.

An oxygen bomb 9 is connected to the oxygen dissolving tower 7 through an inlet side pipe 10. Compressed oxygen gas is supplied into the hollow fibers of the module. A flow meter 11, the first pressure gauge 12 and the first electromagnetic valve 13, in this order when viewed from the bomb 9, are disposed in the middle of the pipe 10. A gas discharging pipe 14 for oxygen gas not dissolved which communicates with the interior of the hollow fibers is connected to the upper portion of the oxygen dissolving tower 7. An outlet side pipe 15 is also connected to the upper portion of the oxygen dissolving tower 7. The second flow meter 16, the second electromagnetic valve 17 and a filter 18, in this order when viewed from the oxygen dissolving tower 7, are disposed in the middle of the pipe 15. The other end of the outlet side pipe 15 is connected to a cleaning apparatus.

The following will describe the preparation of a cleaning fluid in the aforementioned cleaning fluid preparing apparatus.

The pump 4 is firstly operated so that pure water in the pure tank 1 is supplied into the right compartment divided by the gas permeable membrane in the deaerating tower 3. At the same time, the vacuum pump 6 is operated so that air in the left compartment divided by the gas permeable membrane in the deaerating tower 3 is discharged and the pressure inside it is reduced. Thus, the air in the pure water supplied to the right compartment is shifted into the left compartment through the gas permeable membrane. In this manner, the gas in the pure water is removed.

The deaerated pure water is supplied through the pipe 8 into the oxygen dissolving tower 7 in which the hollow fiber module is charged, so as to rise while contacting the hollow fiber module. Compressed oxygen gas having a predetermined pressure, for example, from 0.1 to 0.9 $Kg/cm^2$ is supplied from the oxygen bomb 9 through the inlet side pipe 10 into the hollow fiber module charged in the oxygen dissolving tower 7. At that time, the supplied, compressed oxygen is dissolved into the pure water flowing outside the module in the step wherein the oxygen passes through the hollow fiber in the module. Because oxygen is compressed, the amount of oxygen dissolved into the pure water is greatly raised as compared with the case of supplying oxygen gas into the hollow fiber of the module at ordinary pressure. As a result, in the case of supplying oxygen gas into the hollow fiber module, for example, at 0.5 $Kg/cm^2$ or more, oxygen can be dissolved in the deaerated pure water in an amount of at largest 40 ppm.

When the compressed oxygen gas is supplied to the oxygen dissolving tower 7, it is preferred that the pressures at the inlet side pipe 10 and the outlet pipe 15 are made equal by using the first and second electromagnetic valves 13 and 16 and the first and second pressure gauges 12 and 17 disposed in the middle of the pipes 10 and 15. Setting such a pressure condition makes it possible to dissolve the compressed oxygen gas in the pure water efficiently in the oxygen dissolving tower 7 and prevent the pure water from flowing into the hollow fibers.

The pure water in which oxygen prepared in the oxygen dissolving tower 7 is dissolved is carried through the outlet side pipe 15 to a given cleaning apparatus, and simultaneously floating substances and the like are removed from the pure water with the filter 18 disposed in the middle of the pipe 15.

Therefore, the cleaning fluid preparing apparatus shown in FIG. 1 is used so that the gas in the pure water can be removed and a cleaning fluid having a large amount of dissolved oxygen (at largest 40 ppm at 25° C.), which cannot be obtained by bubbling oxygen gas, can be prepared.

Hydrogen generated by, for example, electrolyzing water is permitted to be dissolved in the cleaning fluid by bubbling process or gas-liquid contact process using hollow fibers.

In preparing the cleaning fluid, an acid such hydrochloric acid or sulfuric acid is permitted to be added into ultra pure water before or after oxygen is dissolved into it. In addition of the acid, the pH of the cleaning fluid is preferably adjusted into from 1 to 6.

(The second step)

An object to be cleaned is cleaned by bringing it into contact with the cleaning fluid to which ultrasonic vibration is being applied.

The object cleaned includes, for example, wafers made from various materials for a semiconductor device, a glass substrate used for a liquid crystal display device and other electric elements.

The frequency of the ultrasonic vibration is preferably 20 kHz or more.

In order to clean the object by bringing it into contact with the cleaning fluid to which ultrasonic vibration is being applied, an ultrasonic cleaning apparatus is used, such as an ultrasonic cleaning apparatus in a nozzle type which has therein a vibrator, an ultrasonic cleaning apparatus in a bar form, and an ultrasonic cleaning apparatus having a cleaning tank to which a vibrator is fitted.

According to the cleaning method of the invention described above, oxygen is dissolved into the cleaning fluid to which ultrasonic vibration is being applied, and consequently it is possible to more efficiently remove impurities, in particular particles, adhering to the surface of the object to be cleaned, such as the bare wafer, than the case of using ultra pure water as a cleaning fluid.

Hitherto, it has been considered that dissolution of gas such as oxygen in a cleaning fluid is disadvantageous for removal of contamination by ultrasonic cleaning. Suprisingly, however, the cleaning fluid in which oxygen is dissolved exhibits a very high cleaning power. This is thought to be based on the following reason. The amount of generation of hydroxy radicals (OH*) increases more in the case wherein ultrasonic vibration is applied to the cleaning fluid in which oxygen is dissolved into pure water than in the case wherein ultrasonic vibration is applied to the cleaning fluid wherein no oxygen is dissolved into pure water. As a result, when the object tube cleaned is treated with this cleaning fluid, particles on the object can be removed efficiently.

Since gas is beforehand removed from the cleaning fluid, it is possible to prevent a drop in efficiency of transmitting ultrasonic vibration caused by bubbles and damage of the vibrator caused by adhesion of bubbles onto the vibrator.

Furthermore, a cleaning fluid wherein an acid such hydrochloric acid or sulfuric acid is added into ultra pure water may be used as a cleaning fluid, so that the particles on the surface of the object tube cleaned can be removed far more efficiently.

The following will describe another cleaning method according to the present invention.
(The first step)

Gas is firstly removed from pure water and subsequently nitrogen is dissolved into this pure water to prepare a cleaning fluid.

For dissolving nitrogen into pure water, for example, the aforementioned bubbling process and gas-liquid contact process can be used.

The amount of dissolved nitrogen (nitrogen dissolved amount) is preferably 5 ppm, or more.
(The second step)

An object to be cleaned is cleaned by bringing it into contact with the cleaning fluid to which ultrasonic vibration is being applied.

The object to be cleaned includes, for example, wafers made from various materials for a semiconductor device, a glass substrate used for a liquid crystal display device and other electric elements.

The frequency of the ultrasonic vibration is preferably 20 kHz or more.

In order to clean the object by bringing it into contact with the cleaning fluid to which ultrasonic vibration is being applied, an ultrasonic cleaning apparatus is used, such as an ultrasonic cleaning apparatus in a nozzle type which has therein a vibrator, an ultrasonic cleaning apparatus in a bar form, and an ultrasonic cleaning apparatus having a cleaning tank to which a vibrator is fitted.

According to the cleaning method of the invention described above, nitrogen is dissolved into the cleaning fluid to which ultrasonic vibration is being applied, and consequently it is possible to more efficiently remove impurities, in particular particles, adhering to the surface of the object to be cleaned than the case of using ultra pure water as a cleaning fluid.

This high cleaning power is thought to be based on the following reason. When ultrasonic vibration is applied to the cleaning fluid, very small quantities of $NO_3^-$ ion and $NO_2^-$ ion are produced so that the effect of cleaning impurities can be improved by these ions.

The following will describe still another cleaning method according to the present invention.
(The first step)

Gas is firstly removed from pure water and subsequently hydrogen produced by electrolyzing water is dissolved into this pure water to prepare a cleaning fluid.

For dissolving the hydrogen produced by electrolysis into pure water, for example, the aforementioned bubbling process and gas-liquid contact process can be used.

It is preferred that the amount of the dissolved hydrogen (hydrogen dissolved amount) is preferably 0.3 ppm or more. According to the bubbling process and the gas-liquid contact process, hydrogen can be dissolved into pure water up to about 2 ppm, for example, at 25° C.

An alkali agent is permitted to be added into the cleaning fluid before and after hydrogen is dissolved. The alkali agent may be at least one selected from ammonium hydroxide ($NH_4OH$), tetramethylammonium hydroxide and chlorine.

It is preferred that the amount of the added alkali agent is from 0.1 to 1000 mmole/liter. In the addition of the alkali agent, it is difficult to sufficiently exhibit the effect caused by addition of the alkali agent if the amount of the added alkali agent is less than 0.1 mmole/liter. On the contrary, if the amount of the added alkali agent is more than 1000 mmole/liter, roughing may occur on the surface of, for example silicone wafer. The amount of the added alkali agent is more preferably from 0.5 to 800 mmole/liter.
(The second step)

An object to be cleaned is cleaned by bringing it into contact with the cleaning fluid to which ultrasonic vibration is being applied.

The object to be cleaned includes, for example, wafers made from various materials for a semiconductor device, a glass substrate used for a liquid crystal display device and other electric elements.

The frequency of the ultrasonic vibration is preferably 20 kHz or more.

In order to clean the object by bringing it into contact with the cleaning fluid to which ultrasonic vibration is being applied, an ultrasonic cleaning apparatus is used, such as the ultrasonic cleaning apparatus in a nozzle type which has therein a vibrator, an ultrasonic cleaning apparatus in a bar form, and an ultrasonic cleaning apparatus having a cleaning tank to which a vibrator is fitted.

This cleaning fluid may be used as a cleaning fluid for brush-cleaning.

According to the cleaning method of the invention described above, hydrogen is dissolved into the cleaning fluid to which ultrasonic vibration is being applied, and consequently it is possible to more efficiently remove impurities, in particular particles, adhering to the surface of the object to be cleaned than the case of using ultra pure water as a cleaning fluid.

Hydrogen produced by electrolyzing water is being used, so as to overcome such economical problems as exchanging of the hydrogen cylinder or needing a place for stocking the bombs in the case of dissolving hydrogen from the hydrogen cylinder. Cathode electrolyzed water, wherein hydrogen is dissolved in water by directly electrolyzing the water, may be contaminated by incorporation of impurities from electrodes. On the contrary, the cleaning fluid wherein hydrogen produced by electrolyzing water is dissolved into deaerated pure water makes it possible to prevent incorporation of impurities from electrodes and contamination.

Hydrogen exhibiting reducing property is dissolved into ultra pure water, therefore, even if a pattern of a metal which is liable to be oxidized, such as a wiring layer of copper, is present on the surface of the object to be cleaned, it is possible to restrain the oxidization and corrosion of the metal pattern during the cleaning process.

The cleaning fluid to which at least one alkali agent selected from ammonium hydroxide ($NH_4OH$), tetramethylammonium hydroxide and chlorine is added in a given amount may be used, so that particles on the object cleaned can be removed far more efficiently.

The following will describe another cleaning method according to the present invention.

(The first step)

Oxygen in an amount of 2 ppm or more is dissolved into deaerated pure water to prepare a cleaning fluid.

This cleaning fluid having a high amount of dissolved oxygen is prepared by using the aforementioned cleaning fluid preparing apparatus shown in FIG. 1.

If the amount of dissolved oxygen (dissolved oxygen amount) in the cleaning fluid is less than 2 ppm, it is difficult to efficiently remove particles such as polishing particles and polished scraps adhering on the surface of a semiconductor wafer which has on its surface an embedded metal wiring when the wafer is cleaned. The dissolved oxygen amount in the cleaning fluid is more preferably 10 ppm or more. However, the upper limit of the dissolved oxygen amount in the cleaning fluid is decided dependently on the maximum oxygen dissolved amount in the oxygen dissolving tower into which compressed oxygen is introduced, in the preparing apparatus shown in FIG. 1, and the upper limit is about 40 ppm.

Ozone in an amount of from 0.1 to 0.2 ppm may be added into the cleaning fluid.

Hydrogen may be dissolved into the cleaning fluid by, for example, bubbling process or gas-liquid contact process.

(The second step)

The semiconductor wafer having a surface on which an embedded metal wiring is formed by chemical-mechanical polishing (CMP) is brought into contact with the cleaning fluid to which ultrasonic vibration is being applied, so as to clean the wafer.

The metal wiring may be a wiring made of, for example, Cu, Cu alloy, Al, Al alloy, Mo, W, Ti, TiN, Pt, or, Ru.

The frequency of the ultrasonic vibration is preferably 20 kHz or more.

In order to clean the object by bringing it into contact with the cleaning fluid to which ultrasonic vibration is being applied, an ultrasonic cleaning apparatus is used, such as an ultrasonic cleaning apparatus in a nozzle type which has therein a vibrator, an ultrasonic cleaning apparatus in a bar form, and an ultrasonic cleaning apparatus having a cleaning tank to which a vibrator is fitted.

According to this cleaning method of the present invention described above, a semiconductor wafer having a surface on which an embedded metal wiring is formed is brought into contact with the cleaning fluid having a high amount of dissolved oxygen of 20 ppm or more to which ultrasonic vibration is being applied, so that particles can be removed very efficiently which adhere onto the surface of the semiconductor wafer in the step of CMP, such as polishing particles and polished scraps (metal scraps).

Hitherto, a cleaning fluid wherein ozone in an amount of 1 ppm or more is dissolved into pure water has been used for a cleaning method of removing particles which adhere onto the surface of a semiconductor wafer in the step of CMP, such as polishing particles and polished scraps (metal scraps). In the case of using this cleaning fluid, however, the embedded copper wiring layer on the surface may be corroded. On the contrary, in the case of using such a cleaning fluid in which oxygen in a given amount is dissolved as in the present invention so as to clean an embedded metal wiring on a semiconductor wafer, it is possible to prevent corrosion of the embedded metal wiring. This is based on the fact that the cleaning fluid wherein oxygen is dissolved into pure water has a lower oxidation-reduction potential than conventional cleaning fluids wherein ozone in an amount of 1 ppm or more is dissolved into pure water.

Furthermore, hydrogen may be dissolved into the cleaning fluid so that the corrosion of the embedded metal wiring on the semiconductor wafer can be prevented far more effectively.

The following will describe specific preferred examples according to the present invention.

EXAMPLE 1

Gas contained in pure water having a resistivity of 18 MΩ or more was firstly removed and then oxygen produced by electrolyzing water in amounts of 5 and 8 ppm was dissolved into the pure water by bubbling, so as to prepare cleaning fluids. Polystyrene based-latex particles having an average particle size of 1 μm were dispersed and applied onto the surface of a silicon wafer to intentionally contaminate the surface.

Subsequently the wafer was held on a rotary disk and a nozzle type-ultrasonic vibration cleaning apparatus having therein a vibrator was located so that its tip was positioned at a distance of 10 mm apart from the surface of the wafer. While the wafer was rotated at a speed of 700 rpm, the cleaning fluid to which ultrasonic vibration was being applied was jetted out on the surface of the wafer from the ultrasonic vibration cleaning apparatus, so as to clean the wafer. The ultrasonic vibration of the wafer at a distance of 10 mm apart from the nozzle was investigated with a sound wave measuring device (trade name: OMP-200, ex Shibaura Seisakusyo Corp.) using a piezoelectric element.

In this cleaning step, power applied to the vibrator of the ultrasonic vibration cleaning apparatus were changed and the amounts of dissolved oxygen (dissolved oxygen amount) were also changed. Cleaning effects obtained in this manner were evaluated. Results thus obtained are shown in FIG. 2.

Figure 2:
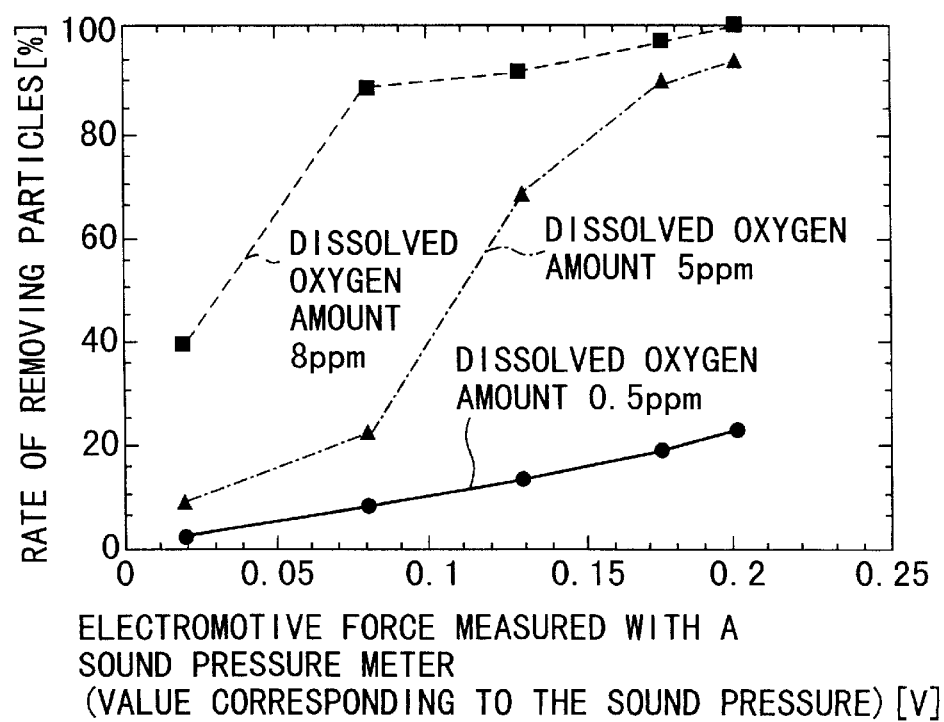
FIG. 2 is a view showing the relationship between the sound pressure on the surface of a wafer and the particle removing rate when cleaning fluids having different dissolved oxygen amounts to which ultrasonic vibration is being applied in Example 1 are jetted out onto a silicon wafer compulsorily contaminated.

As is evident from FIG. 2, in the case wherein the amounts of dissolved oxygen in the cleaning fluids were the same, the efficiency of removing particles on the surface of the wafer (the cleaning effect) increases in proportion to the sound pressure. In the case wherein the sound pressures were the same, the cleaning effect became higher as the amount of dissolved oxygen was larger.

EXAMPLE 2

Oxygen produced by electrolyzing water was allowed to flow into hollow fibers constituting an artificial lung module (trade name: SAFE II, ex Polystein Corp.) and simultaneously deaerated pure water having a resistivity of 18 MΩ or more was allowed to flow on the outer surface of the module, so as to prepare a cleaning fluid wherein oxygen in an amount of 8 ppm was dissolved into the pure water.

In the same manner as in Example 1 (ultrasonic vibration generated with a nozzle type-ultrasonic vibration cleaning apparatus; 1.6 MHz), the surface of a wafer which was intentionally contaminated with polystyrene-based latex particles was cleaned with the prepared cleaning fluid, so as to exhibit the same high cleaning effect as by Example 1.

EXAMPLE 3

Gas contained in pure water having a resistivity of 18 MΩ or more was firstly removed and then oxygen produced by electrolyzing water in an amount of 20 ppm was dissolved into the pure water by gas-charging process using hollow fibers. Into it, hydrochloric acid or sulfuric acid was added in an amount of 2% by weight, so as to prepare a cleaning fluid. CuO particles having an average particle size of 2 μm were dispersed and applied onto the surface of a silicon wafer to intentionally contaminate the surface. Note that the initial number of the particles was 1500.

Subsequently the wafer was held on a rotary disk, and a nozzle type-ultrasonic vibration cleaning apparatus having therein a vibrator was located so that its tip was positioned at a distance of 10 mm apart from the surface of the wafer. While the wafer was rotated at a speed of 700 rpm, the cleaning fluid to which ultrasonic vibration having a frequency of 1.6 MHz was being applied was jetted out on the surface of the wafer from the ultrasonic vibration cleaning apparatus, so as to clean the wafer for a minute.

For comparison, the surface of the wafer compulsorily contaminated with CuO particles in the aforementioned manner was cleaned with a cleaning fluid into which oxygen was dissolved in an amount of 20 ppm.

Consequently, the numbers of the remaining particles were 106, 43 and 56, in the case of using the cleaning fluid into which only oxygen was dissolved, in the case of using the cleaning fluid into which hydrochloric acid was added, and in the case of using the cleaning fluid into which sulfuric acid was added, respectively. Thus, addition of the acid caused the cleaning effect to be improved.

EXAMPLE 4

Gas contained in pure water having a resistivity of 18 MΩ or more was firstly removed and then nitrogen in an amount of 3 ppm was dissolved into the pure water, so as to prepare a cleaning fluid. Polystyrene based-latex particles having an average particle size of 1 μm were dispersed and applied onto the surface of a silicon wafer to intentionally contaminate the surface. Note that the initial number of the particles was 1500.

Subsequently the wafer was held on a rotary disk and a nozzle type-ultrasonic vibration cleaning apparatus having therein a vibrator was located so that its tip was positioned at a distance of 10 mm apart from the surface of the wafer. While the wafer was rotated at a speed of 700 rpm, the cleaning fluid to which ultrasonic vibration having a frequency of 1.6 MHz was being applied was jetted out on the surface of the wafer from the ultrasonic vibration cleaning apparatus, so as to clean the wafer for a minute.

For comparison, the surface of the wafer compulsorily contaminated in the aforementioned manner was cleaned with ultrapure water having a resistivity of 18 MΩ or more as a cleaning fluid. (The initial number of the particles was 1500.) Consequently, the numbers of the remaining particles were 1400 and 136, in the case of using the ultrapure water for cleaning, and in the case of Example 4, respectively. Thus, Example 4 exhibited high cleaning effect.

The cleaning fluid of Example 4 was charged into a closed container and then ultrasonic vibration having a frequency of 1 MHz was applied, to produce $NO_3^-$ ion and $NO_2^-$ ion.

EXAMPLE 5

Gas contained in pure water having a resistivity of 18 MΩ or more was firstly removed and then hydrogen produced by electrolyzing water in an amount of 2 ppm was dissolved into the pure water by bubbling, so as to prepare a cleaning fluid. Polystyrene based-latex particles having an average particle size of 0.2 μm were dispersed and applied onto the surface of a silicon wafer to intentionally contaminate the surface. Note that the initial number of the particles was 20000.

Subsequently the wafer was held on a rotary disk and a nozzle type-ultrasonic vibration cleaning apparatus having therein a vibrator was located so that its tip was positioned at a distance of 10 mm apart from the surface of the wafer. While the wafer was rotated at a speed of 700 rpm, the cleaning fluid to which ultrasonic vibration having a frequency of 1.6 MHz was being applied was jetted out for a minute on the surface of the wafer from the ultrasonic vibration cleaning apparatus, so as to clean the wafer.

For comparison, a cleaning fluid consisting of pure water having a resistivity of 18 MΩ or more into which hydrogen was dissolved in an amount of 2 ppm was jetted out from a shower nozzle on the surface of the wafer compulsorily contaminated for a minute to clean the surface.

Consequently, the numbers of the remaining particles were 12476, and 2234, in the case of showering the cleaning fluid into which hydrogen was dissolved, and in the case of jetting out the cleaning fluid into which hydrogen was dissolved and to which ultrasonic vibration was being applied in Example 5, respectively. Thus, Example 5 exhibited high cleaning effect.

EXAMPLE 6

Gas contained in pure water having a resistivity of 18 MΩ or more was firstly removed and then hydrogen produced by electrolyzing water in an amounts of 2 ppm was dissolved into the pure water by bubbling. Into it, added were tetramethylammmonium hydroxide (TMAH) in amounts of 0.05, 0.1, 10, 100 and 1000 mmole/liter, respectively; chlorine in amounts of 0.05, 0.1, 10, 100 and 1000 mmole/liter, respectively; and ammonium hydrocloride ($NH_4OH$) in amounts of 0.05, 0.1, 10 and 100 mmole/liter, respectively, to prepare 14 sorts of cleaning fluids. $SiO_2$ particles having an average particle size of 1 μm were dispersed and applied onto the surface of a silicon wafer to intentionally contaminate the surface. Note that the initial number of the particles was 4,600.

Subsequently the wafer was held on a rotary disk and a nozzle type-ultrasonic vibration cleaning apparatus having therein a vibrator was located so that its tip was positioned at a distance of 10 mm apart from the surface of the wafer. While the wafer was rotated at a speed of 700 rpm, the cleaning fluid to which ultrasonic vibration having a frequency of 1.6 MHz was being applied was jetted out for a minute on the surface of the wafer from the ultrasonic vibration cleaning apparatus, so as to clean the wafer.

The number of the remaining $SiO_2$ particles after cleaning was counted. Results thus obtained are shown in Table 1. In the case of No.2 as shown in Table 1, a cleaning fluid into which hydrogen was dissolved in an amount of 2 ppm was jetted out for a minute from a shower nozzle on the surface of the wafer compulsorily contaminated, to clean the surface. In the case of No. 2 as shown in Table 1, a cleaning fluid into which hydrogen was dissolved in an amount of 2 ppm was jetted out for a minute on the surface of the wafer intentionally contaminared from the ultrasonic vibration cleaning apparatus to clean the surface.

TABLE 1

| No. | | The number of remaining SiO$_2$ particles |
|---|---|---|
| 1 | Initial | 4600 |
| 2 | Hydrogen dissolved cleaning fluid | 3600 |
| 3 | Hydrogen dissolved cleaning fluid + Application of ultrasonic vibration | 269 |
| 4 | Addition of TMAH 0.05 mmole/liter | 236 |
| 5 | Addition of TMAH 0.1 mmole/liter | 178 |
| 6 | Addition TMAH 10 mmole/liter | 108 |
| 7 | Addition of TMAH 100 mmole/liter | 36 |
| 8 | Addition of TMAH 1000 mmole/liter | 66 |
| 9 | Addition of chlorine 0.05 mmole/litter | 283 |
| 10 | Addition of chlorine 0.1 mmole/litter | 208 |
| 11 | Addition of chlorine 10 mmole/litter | 166 |
| 12 | Addition of chlorine 100 mmole/litter | 132 |
| 13 | Addition of chorine 1000 mmole/litter | 106 |
| 14 | Addition of NH$_4$OH 0.05 mmole/liter | 198 |
| 15 | Addition of NH$_4$OH 0.1 mmole/liter | 140 |
| 16 | Addition of NH$_4$OH 10 mmole/liter | 42 |
| 17 | Addition of NH$_4$OH 100 mmole/liter | 67 |

As is evident from Table 1, in the cleaning methods of Nos. 5–8, 10–13 and 15–17, using the cleaning fluids wherein tetramethylammmonium hydroxide, chlorine and ammonium hydroxide were added in specified amounts (0.1–1000 mmole/liter) into pure water into which hydrogen was dissolved, the SiO$_2$ particles were able to be removed more efficiently and higher cleaning effect was exhibited than the method of No. 2, wherein the cleaning fluid into which hydrogen was dissolved was showered for cleaning, and the method of No. 3, wherein cleaning with high frequency wave was carried out using the cleaning fluid into which hydrogen was dissolved.

In the cleaning methods of Nos. 4, 9 and 14, using the cleaning fluid into which tetramethylammmonium hydroxide, chlorine and ammonium hidroxide were added in amounts of less than 0.1 mmole/liter, respectively, the efficiency of removing the particles was substantially the same as that of the method wherein cleaning with high frequency wave was carried out using the cleaning fluid into which hydrogen was dissolved. Thus, effect by addition thereof was not able to be exhibited sufficiently.

EXAMPLE 7

Gas contained in pure water having a resistivity of 18 MΩ or more was firstly removed and then oxygen in an amount of from 1–40 ppm was dissolved into the pure water, so as to prepare cleaning fluids. The cleaning fluids having a dissolved oxygen amount of less than 20 ppm were prepared by bubbling oxygen into the deaerated pure water. The cleaning fluids having a dissolved oxygen amount of more than 20 ppm were prepared by controlling compression power for oxygen gas supplied from the oxygen gas bombs 9 in the cleaning fluid preparing apparatus shown in FIG. 1.

Alumina particles having an average secondary particle size of 0.2 μm were dispersed and applied onto the surface of a silicon wafer to intentionally contaminate the surface.

Subsequently the wafer was held on a rotary disk and a nozzle type-ultrasonic vibration cleaning apparatus having therein a vibrator was located so that its tip was positioned at a distance of 10 mm apart from the surface of the wafer. While the wafer was rotated at a speed of 700 rpm, each of the cleaning fluids to which ultrasonic vibration was being applied was jetted out on the surface of the wafer from the ultrasonic vibration cleaning apparatus, so as to clean the wafer.

Figure 3:
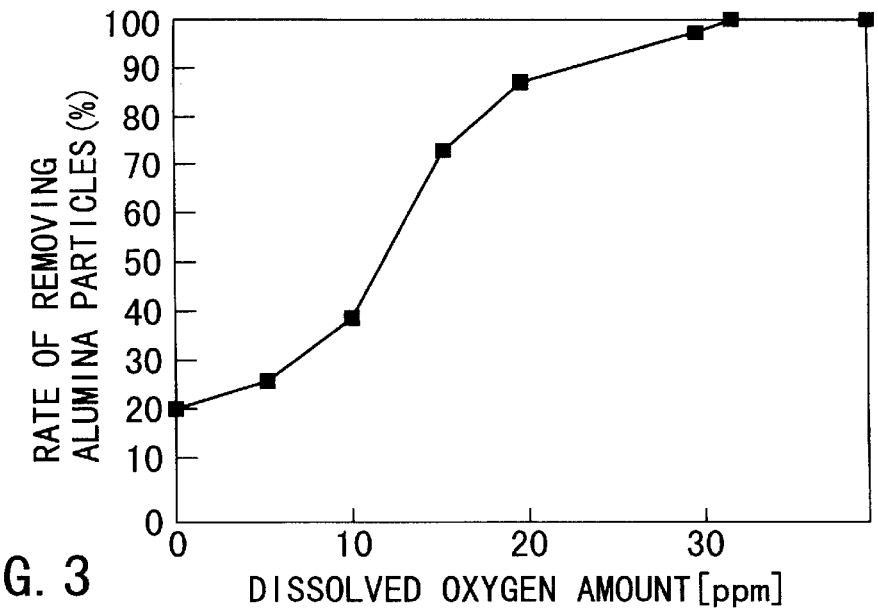
FIG. 3 is a view showing the rate of removing alumina fine particles, when cleaning is carried out using cleaning fluids having different dissolved oxygen amounts in Example 7.

FIG. 3 shows the relationship between the amount of dissolved oxygen in the cleaning fluids and the rate of removing alumina particles.

As is evident from FIG. 3, the rate of removing the alumina particles became higher as the amount of dissolved oxygen was increased. The cleaning fluid having a dissolved oxygen amount of, in particular, 20 ppm or more had a remarkably improved efficiency of removing the alumina particles.

EXAMPLE 8

The cleaning fluid preparing apparatus shown in FIG. 1 was used to prepare a cleaning fluid wherein oxygen was dissolved in an amount of 40 ppm into deaerated pure water having a resistivity of 18 MΩ or more.

Alumina particles having an average secondary particle size of 0.2 μm were dispersed and applied onto the surface of a silicon wafer to intentionally contaminate the surface. This wafer was held on a rotary disk and a nozzle type-ultrasonic vibration cleaning apparatus having therein a vibrator was located so that its tip was positioned at a distance of 10 mm apart from the surface of the wafer. While the wafer was rotated at a speed of 700 rpm, the cleaning fluid to which ultrasonic vibration was being applied was jetted out for a minute on the surface of the wafer from the ultrasonic vibration cleaning apparatus, so as to clean the wafer. After this cleaning step, the rate of removing the alumina particles from the surface of the wafer was measured. Results thus obtained are shown in table 2.

A silicon wafer onto which a copper standard liquid for atomic absorption spectrometry having a concentration of 1000 ppm was applied in an amount of $1 \times 10^{12}$ atoms/cm$^2$ was held on a rotary disk and a nozzle type ultrasonic vibration cleaning apparatus having therein a vibrator was located so that its tip was positioned at a distance of 10 mm apart from the surface of the wafer. While the wafer was rotated at a speed of 700 rpm, the cleaning fluid to which ultrasonic vibration was being applied was jetted out for a minute on the surface of the wafer from the ultrasonic vibration cleaning apparatus, so as to clean the wafer. After that, the silicon wafer was treated with diluted hydrofluoric acid having a concentration of 1%. After this cleaning step, the rate of removing copper from the surface of the wafer was examined. Results thus obtained are shown in Table 2 below.

Furthermore a copper plate was held on the rotary disk and a nozzle type-ultrasonic vibration cleaning apparatus having therein a vibrator was located so that its tip was positioned at a distance of 10 mm apart from the surface of the wafer. While the wafer was rotated at a speed of 700 rpm, the cleaning fluid to which ultrasonic vibration was being applied was jetted out for a minute on the surface of the wafer from the ultrasonic vibration cleaning apparatus, so as to clean the wafer. The copper plate after the cleaning was observed with a microscope. Result thus obtained are also shown in Table 2.

EXAMPLE 9, AND COMPARATIVE EXAMPLES 1 and 2

A silicon wafer intentionally contaminated with alumina particles, silicon wafer intentionally contaminated with a copper standard liquid, and a copper plate were cleaned with ultrasonic vibration in the same manner as in Example 8, except using: a cleaning fluid wherein oxygen in an amount of 17 ppm and ozone in an amount of 0.2 ppm were dissolved into deaerated pure water having a resistivity of 18 MΩ or more (Example 9); deaerated pure water having a resistivity of 18 MΩ or more (Comparative Example 1); and a cleaning fluid wherein oxygen in an amount of 20 ppm and ozone in an amount of 1.0 ppm were dissolved into deaerated pure water having a resistivity of 18 MΩ or more (Comparative Example 2); respectively. Results thus obtained are shown in Table 2 below.

TABLE 2

| | Cleaning fluid | Rate of removing particles (%) | Rate of removing copper (%) | State of the surface of the copper plate |
|---|---|---|---|---|
| Comparative Example 1 | Deaerated pure water | 20.0 | 5 | No corrosin |
| Example 8 | Deaerated pure water having a dissolved oxygen amount of 40 ppm | 99.5 | 75 | No corrosin |
| Example 9 | Deaerated pure water having a dissolved oxygen amount of 17 ppm and a dissolved ozone amount of 0.2 ppm | 83.0 | 35 | No corrosion |
| Comparative Example 2 | Deaerated pure water having a dissolved oxygen amount of 20 ppm and a dissolved ozone amount of 1.0 ppm | 86.0 | 68 | Local corrosions exists |

As is clear from table 2, in the cleaning method of Example 8 using the cleaning fluid having a dissolved oxygen amount of 40 ppm, and in the cleaning method of Example 9 using the cleaning fluid having a dissolved oxygen amount of 17 ppm and a dissolved ozone amount of 0.2 ppm, the particles such as alumina particles and polished scraps (mainly copper scraps) were removed more efficiently and the copper plate was subjected to smaller damage than in Comparative Example 1 using the cleaning fluid composed of deaerated pure water. The cleaning method of Example 8 using in particular the cleaning fluid having a dissolved oxygen amount of 40 ppm exhibited a high cleaning effect for the aforementioned particles.

On the contrary, in the Comparative Example 2 using the cleaning fluid having a dissolved oxygen amount of 20 ppm and a dissolved ozone amount of 1.0 ppm, a high cleaning effect for the particles was exhibited but local corrosions broke out in cleaning the copper plate. Therefore, when the cleaning method of Comparative Example 2 is applied to a silicon wafer whose surface have an embedded copper wiring, corrosions may break out in the copper wiring layer.

EXAMPLE 10

Figure 4A:
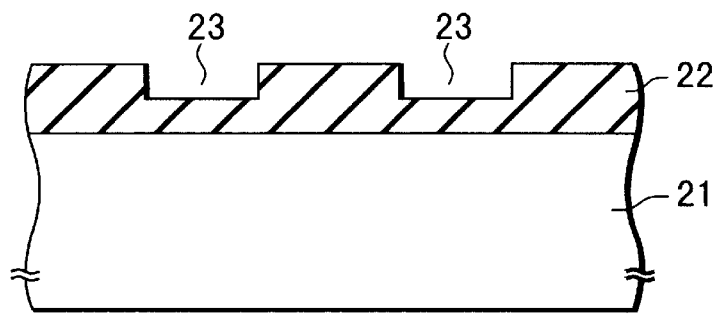
FIGS. 4A–4C are cross sections illustrating the process for producing an embedded copper wiring layer in Example 10.
Figure 4B:
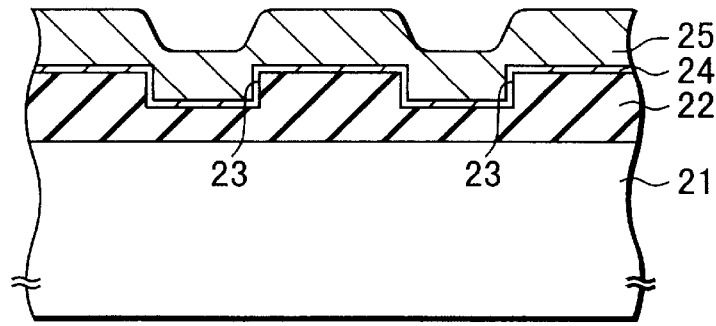

As shown in FIG. 4A, by a CVD process, a $SiO_2$ film 22 as an interlayer dielectric film which had a thickness of, e.g., 1000 nm was deposited on a silicon wafer 21 on which diffused layers such as source and drain layers were formed. After that, a photoethcing process was used to form grooves 23 having depth of 500 nm and a shape corresponding to a wiring layer on the $SiO_2$ film 22. As shown in FIG. 4B, on the $SiO_2$ film 22 including the grooves 23, a barrier layer 24 comprising TiN and having a thickness of 15 nm and a Cu film 25 having a thickness of 600 nm were deposited in this order by suppuring deposition.

Subsequently, a polishing apparatus not shown was prepared which was composed of a substrate holder having a supporting axis, a turn table whose surface was covered with a polishing pad (trade mark: SUBA 800, ex Rodel Nitta Corp.), and a supplying tube for supplying a polishing liquid onto the polishing pad. The silicon wafer shown in FIG. 4B was held upside down by the substrate holder. The substrate was held on the polishing pad of the turn table in the state that a load of 300 $g/cm^2$ was applied to the substrate by the supporting axis of the holder. While the turn table and the holder were rotated in reverse directions at 100 rpm respectively, the polishing liquid was supplied onto the polishing pad through a supplying tube at 12.5 ml/minute to polish the Cu film 25 and the barrier layer 24 deposited on the silicon wafer 21 until the surface of the $SiO_2$ film 22 was exposed. The polishing liquid used was pure water containing 0.7% by weight of 2-quinoline carboxylic acid, 1.5% by weight of γ-alumina particles having an average particle size of 30 nm, and 4.4% by weight of colloidal silica.

Figure 4C:
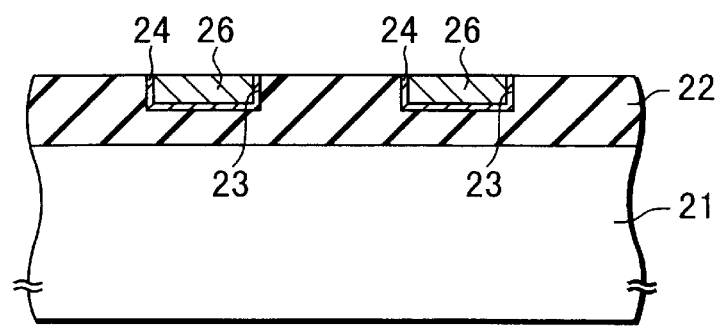

In this chemical mechanical polishing (CMP) step, the convex Cu film 25 shown in FIG. 4B was polished preferentially from the surface mechanically contacting the polishing pad, and further the exposed barrier layer 24 was polished, so that the so-called etch back was carried out. Consequently, as shown in FIG. 4C, the barrier layer 24 remained inside the groove 23 and an embedded Cu wiring layer 26 was formed in the groove 23 covered with the barrier layer 24 so that the surface of the layer 26 had the same level of that of the surface of the $SiO_2$ film 22.

Subsequently, the silicon wafer having on its surface the embedded Cu wiring layer was supported on the rotary disk, and then nozzle type ultrasonic vibration cleaning apparatus having therein a vibrator was located so that its tip was positioned at a distance of 10 mm apart from the surface of the silicon wafer. While the wafer was rotated at a speed of 700 rpm, the same cleaning fluid (the amount of dissolved oxygen: 40 ppm) as in Example 8 to which ultrasonic vibration was being applied was jetted out on the surface of the wafer from the ultrasonic vibration cleaning apparatus, so as to clean the wafer.

As a result, particles, such as polishing particles and copper scraps, which adhered onto the surface of the silicon wafer in the CMP step were able to be removed. Observation of the wafer surface after the cleaning with a microscope did not show any corrosion.

As described above, according to a cleaning method of the present invention, it is possible to efficiently remove contamination, such as particles, on the surface of the object to be cleaned. Thus, this cleaning method can be conveniently applied to fine cleaning steps in the process for producing a semiconductor device, a liquid crystal display, or the like.

Furthermore, according to another cleaning method of the present invention, it is possible to efficiently remove particles on a semiconductor wafer having a surface on which an embedded metal wiring is formed by chemical-mechanical polishing without the embedded metal wiring being corroded. Thus, this cleaning method can be conveniently applied to fine cleaning steps in the process for producing a semiconductor device.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A cleaning method comprising the steps of:
supplying deaerated pure water onto respective hollow fibers of a hollow fiber module comprised of a material having oxygen gas permeability, said hollow fiber module being charged into an oxygen dissolving tower, and supplying compressed oxygen into respective hollow fibers, thereby dissolving oxygen into the pure water to prepare a cleaning fluid; and
cleaning an object to be cleaned by bringing the object into contact with the cleaning fluid to which ultrasonic vibration is being applied.

2. The method according to claim 1, wherein the oxygen is supplied from an oxygen bomb.

3. The method according to claim 1, wherein the amount of dissolved oxygen in the cleaning fluid is from 2 to 40 ppm.

4. The method according to claim 1, wherein an acid is added into the cleaning fluid before or after the oxygen is dissolved.

5. The method according to claim 1, wherein said object to be cleaned is a wafer.

6. The method according to claim 1, wherein said object to be cleaned is a glass substrate for a liquid display device.

7. The method according to claim 1, wherein applying ultrasonic vibration to said cleaning fluid is performed by using a nozzle type-vibration cleaning apparatus having a vibrator therein.

8. A cleaning method comprising the steps of:
dissolving nitrogen into deaerated pure water to prepare a cleaning fluid; and
cleaning an object to be cleaned by bringing the object into contact with the cleaning fluid to which ultrasonic vibration is being applied.

9. The method according to claim 8, wherein the cleaning fluid is prepared by bubbling nitrogen into the deaerated pure water.

10. The method according to claim 9, wherein the nitrogen is supplied from a nitrogen bomb.

11. The method according to claim 9, wherein the cleaning fluid is prepared by supplying nitrogen into respective hollow fibers of a hollow fiber module comprised of a material having nitrogen gas permeability and supplying deaerated pure water onto the surface of the respective hollow fibers to dissolve nitrogen into the pure water by gas-liquid contact.

12. The method according to claim 11, wherein the nitrogen is supplied from a nitrogen bomb.

13. The method according to claim 8, wherein said object to be cleaned is a wafer.

14. The method according to claim 8, wherein said object to be cleaned is a glass substrate for a liquid display device.

15. The method according to claim 8, wherein applying ultrasonic vibration to said cleaning fluid is performed by using a nozzle type-vibration cleaning apparatus having a vibrator therein.

16. A cleaning method comprising the steps of:
supplying hydrogen into respective hollow fibers of a hollow fiber module comprised of a material having hydrogen gas permeability and supplying deaerated pure water onto the surface of the respective hollow fibers, thereby dissolving hydrogen into the pure water by gas-liquid contact to prepare a cleaning fluid; and
cleaning an object to be cleaned by bringing the object into contact with the cleaning fluid to which ultrasonic vibration is being applied.

17. The method according to claim 16, wherein the amount of dissolved hydrogen in the cleaning fluid is from 0.3 to 2 ppm.

18. The method according to claim 16, wherein an alkali agent is added into the cleaning fluid before or after the hydrogen is dissolved.

19. The method according to claim 18, wherein the alkali agent is at least one selected from the group consisting of ammonium hydroxide tetramethylammonium hydroxide, and chlorine, and the added amount thereof is from 0.1 to 1000 mmole/liter.

20. The method according to claim 18, wherein said object to be cleaned is a wafer.

21. The method according to claim 18, wherein said object to be cleaned is a glass substrate for a liquid display device.

22. The method according to claim 16, wherein applying ultrasonic vibration to said cleaning fluid is performed by using a nozzle type-vibration cleaning apparatus having a vibrator therein.

23. A cleaning method comprising the steps of:
supplying deaerated pure water onto respective hollow fibers of a hollow fiber module comprised of a material having oxygen gas permeability, said hollow fiber module being charged into an oxygen dissolving tower, and supplying compressed oxygen into respective hollow fibers, thereby dissolving oxygen into the pure water to prepare a cleaning fluid; and
bringing a semiconductor wafer having a surface on which an embedded metal wiring is formed by chemical-mechanical polishing into contact with the cleaning fluid to which ultrasonic vibration is being applied.

24. The method according to claim 23, wherein the amount of dissolved oxygen in the cleaning fluid is from 2 to 40 ppm.

25. The method according to claim 23, wherein hydrogen is further dissolved into the cleaning fluid.

26. The method according to claim 23, wherein applying ultrasonic vibration to said cleaning fluid is performed by using a nozzle type-vibration cleaning apparatus having a vibrator therein.

* * * * *

UNITED STATES PATENT AND TRADEMARK OFFICE
CERTIFICATE OF CORRECTION

| | |
|---|---|
| PATENT NO. | : 6,082,373 |
| DATED | : July 4, 2000 |
| INVENTOR(S) | : Naoaki Sakurai, et al. |

It is certified that error appears in the above-identified patent and that said Letters Patent is hereby corrected as shown below:

Title page,
Item [30], the first Foreign Application Priority Data listed is not being claimed.
It should read as follows:

--[30] Foreign Application Priority Data

July 2, 1997 [JP] Japan ......................9-177153--

Signed and Sealed this

Seventh Day of August, 2001

*Attest:*

Nicholas P. Godici

*Attesting Officer*

NICHOLAS P. GODICI
*Acting Director of the United States Patent and Trademark Office*